United States Patent [19]

Henery

[11] 4,182,783

[45] Jan. 8, 1980

[54] METHOD OF VAPOR DEPOSITION

[75] Inventor: Vern A. Henery, Plum Borough, Pa.

[73] Assignee: PPG Industries, Inc., Pittsburgh, Pa.

[21] Appl. No.: 836,177

[22] Filed: Sep. 23, 1977

[51] Int. Cl.² ................. C23C 11/00; C23C 13/12
[52] U.S. Cl. .................. 427/248 B; 118/719; 118/DIG. 5
[58] Field of Search .................. 118/48–49.1, 118/DIG. 5; 427/50–52, 69, 70, 78, 91, 99, 109, 124, 166, 167, 248–255

[56] References Cited

U.S. PATENT DOCUMENTS

| | | | |
|---|---|---|---|
| 2,780,553 | 2/1957 | Pawlyk | 118/49 X |
| 3,198,167 | 8/1965 | Bakish et al. | 118/48 |
| 3,786,309 | 1/1974 | Miottel | 239/15 X |
| 3,852,098 | 12/1974 | Bloss et al. | 427/255 |
| 3,970,037 | 7/1976 | Sopko | 118/48 |

Primary Examiner—Morris Kaplan
Attorney, Agent, or Firm—Donna L. Seidel; E. Kears Pollock

[57] ABSTRACT

An apparatus and method are provided for fluidizing and vaporizing particulate solid coating reactants by first establishing a fluidized bed of dispersed particulant solid coating reactants and thereafter drawing a volume of fluidizing gas and suspended particulate solid coating reactant to a vaporizer while mixing an additional volume of gas therewith and then vaporizing the dispersed particulate solid coating reactant in the reactant-gas mixture. The reactant-gas mixture is then directed into contact with a hot substrate to be coated in order to deposit a film thereon.

11 Claims, 1 Drawing Figure

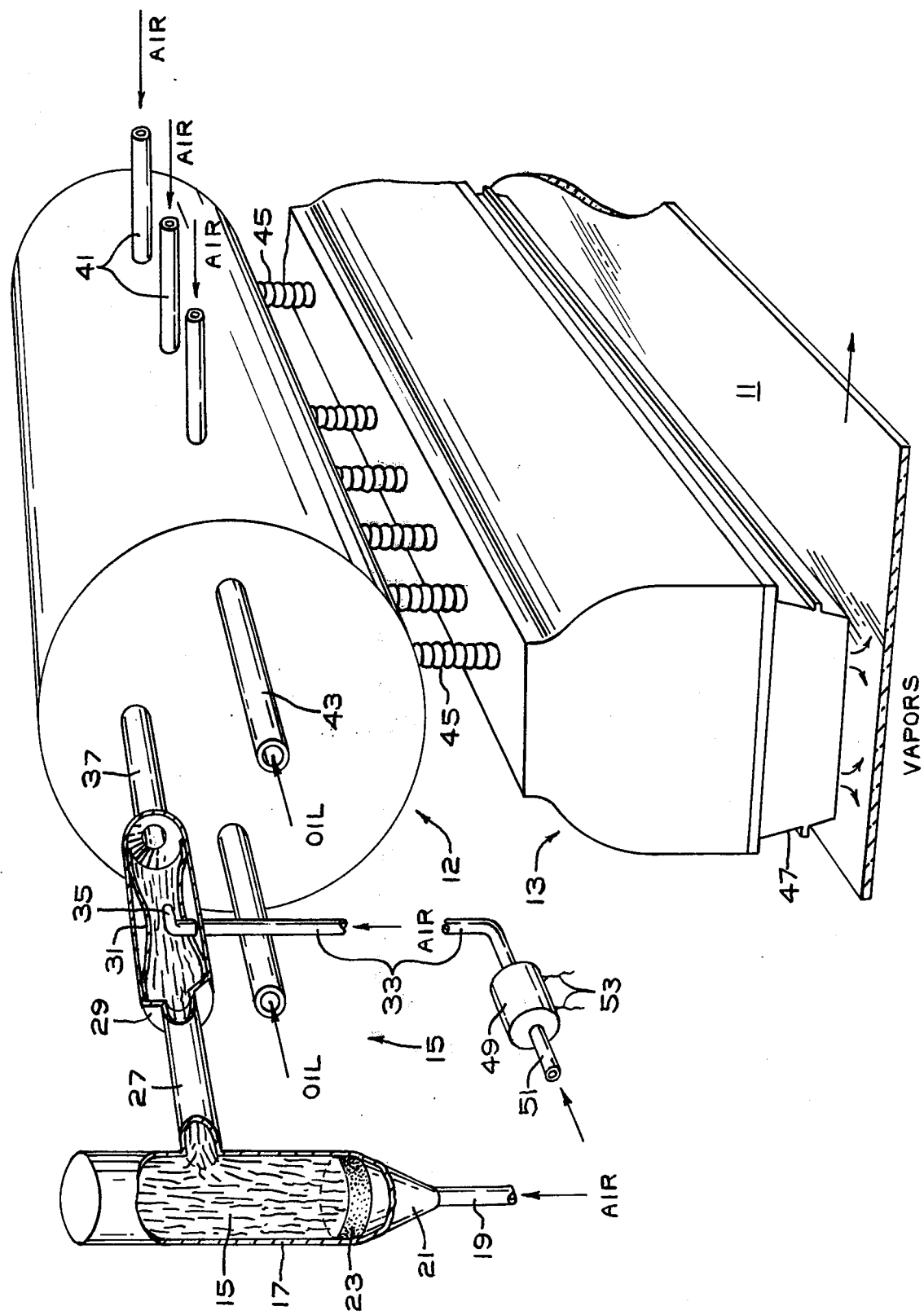

METHOD OF VAPOR DEPOSITION

BACKGROUND OF THE INVENTION

This invention relates to coating substrates, particularly glass substrates, by chemical vapor deposition. This invention more particularly relates to a method for preparing gas-reactant vapor mixtures for use in such chemical vapor deposition methods.

Chemical deposition processes such as pyrolytic processes and hydrolytic processes are well known in the art of coating substrates. The physical form of the coating reactants employed in such processes may be liquid, vapor, liquids or solids dispersed in gas mixtures or vaporized or vaporous coating reactants dispersed in gas mixtures. The use of vaporized or vaporous coating reactants is characterized as a chemical vapor deposition process. U.S. Pat. No. 3,852,098 to Bloss et al teaches the vaporization of dispersed solid coating reactants to provide a reactant vapor suitable for reaction to deposit films on substrates, such as glass.

U.S. Pat. No. 3,970,037 to Sopko discloses a coating composition vaporizer which may be employed to vaporize a vaporizable coating reactant for subsequent delivery through a nozzle or otherwise into contact with a substrate to be coated by a chemical vapor deposition technique. Solid reactants for use in the deposition of films by chemical vapor techniques have been vaporized in a variety of ways. Typically, a fixed bed of particulate solid coating reactant is maintained in a vaporization chamber such as shown in U.S. Pat. No. 2,780,553 to Pawlyk. A hot carrier gas is passed through the fixed bed of coating reactant to vaporize the reactant and to carry the vaporized reactant from the chamber in which the fixed bed of reactant resides to a substrate upon which a film is to be deposited. One of the problems associated with the use of a typical fixed bed coating reactant vaporizer is caused by the tendency for many pyrolytic coating reactants in particular to fuse into a sticky mass when heated so that the vaporizer becomes clogged with liquid coating reactant before the coating reactant can be effectively vaporized. Another problem associated with the use of fixed bed vaporizers has been preignition or the premature combustion or reaction of pyrolytic coating reactants when hot air is employed as a carrier gas.

In accordance with the teachings of both Sopko and Bloss et al, it has already been appreciated that the problems associated with premature combustion or reaction of pyrolytic coating reactant or the undesired fusion of such reactants may be minimized if coating reactants are successfully dispersed in a carrier gas prior to being heated to a sufficient temperature for vaporization of them. Sopko specifically teaches that a spray of mist, fog or smoke of coating reactant into a vaporization chamber is effective for accomplishing vaporization of coating reactants which are unstable to the extent that they are fused or preignited by premature combustion or reaction. Bloss et al specifically teach that it is desirable to disperse a particulate or powdered solid coating reactant prior to vaporization and teach the use of powdered solid coating reactants having particular thermodynamic properites which make them less susceptible to preignition or fusion. The dispersion techniques which have been employed in the past include, in addition to the spray procedure disclosed by Sopko, the distribution of a particulate or powdered solid coating reactant over a large supporting surface such as a tray or a screen.

The present invention contemplates a method for dispersing particulate solid coating reactants prior to their vaporization which are efficient dispersion techniques employing apparatus having essentially no moving parts which are subject to contact by the coating reactants and do not require trays or other devices which may be subject to clogging in the event of inadvertent fusion of coating reactants.

SUMMARY OF THE INVENTION

An apparatus for coating a substrate with a film by deposition from a gaseous or vaporous reactant composition includes a facility for vaporizing a particulate solid coating reactant and a facility for directing a resulting reactant-gas composition into contact with a substrate to be coated. The apparatus is provided with a facility for fluidizing a mass of particulate solid coating reactant that includes a provision for introducing a volume of fluidizing gas through a mass of reactant. The apparatus also includes a facility for drawing a volume of fluidized particulate solid reactant and fluidizing gas through an enclosure and for mixing an additional volume of gas with it to dilute it. The apparatus further incldes a heater to heat the mixture to a sufficient temperature to vaporize the fluidized particulate solid reactant to provide a suitable reactant-gas composition for depositing a coating or film on the substrate to be coated.

A suitable facility for fluidizing particulate solid reactants is a chamber having an inlet opening for receiving a fluidizing gas under pressure and an outlet opening for permitting fluidized reactant and fluidizing gas to be drawn from the chamber. A gas permeable gas distribution plate is mounted inside the chamber to support the mass of solid particulate coating reactant. The permeable gas distribution plate serves to distribute the fluidizing gas through the mass of particulate coating reactant at a rate sufficient to fluidize the particles of solid coating reactant in the mass. The chamber is sized to provide for substantially full fluidization of a mass of particulate solid coating reactant maintained within it.

A preferred chamber is a vertical cylinder having its inlet opening at the bottom and its outlet opening at or near the top of the cylinder with its gas distribution plate mounted across the chamber near the bottom. A sufficient space is maintained beneath the gas distribution plate to provide for pressurized fluidizing gas to be rather uniformly distributed against the bottom face of the gas distribution plate. With such a design, a mass of particulate solid coating reactant may be maintained on top of the gas distribution plate and, when a fluidizing gas, such as air under pressure, is directed up through the gas distribution plate, it tends to lift particles of the particulate solid coating material upwardly while the force of gravity tends to cause the particles to fall downwardly. By proper adjustment of the flow rate and pressure of the fluidizing gas, it is possible to maintain a fluidized bed of particulate solid coating reactant within the chamber which will flow freely as a fluid with the particles of coating reactant dispersed from one another and suspended by the fluidizing gas flowing through the chamber.

A particularly desired fluidizing chamber may be constructed to include a gas distribution plate made of porous or spongy metal such as a sintered metal disc or plate. A plate may be made up as a composite of two plates having a plurality of holes in each and having the appearance of a strainer with a metal or mineral wool packed between the plates.

A suitable facility for drawing a volume of fluidized particulate solid reactant and fluidizing gas from the fluidizing chamber is an aspirator having a gas ejector mounted within it. The gas ejector has an inlet for receiving the additional volume of gas which is to be added to the volume of fluidizing gas and fluidized particulate solid coating reactant. A suitable aspirator is a vacuum ejector, particularly a Venturi ejector, which is effectively employed to add an additional volume of diluting gas to the withdrawn volume. The volume of diluting gas relative to the volume of fluidizing gas and fluidized particulate solid coating reactant may be varied widely.

A suitable facility for heating the gaseous mixture which results from mixing the additional volume of gas with the volume of fluidizing gas and dispersed particulate solid coating reactant may be a vaporization chamber such as that taught by Sopko. U.S. Pat. No. 3,970,037 is incorporated by reference herein to illustrate that vaporization device and also to illustrate a suitable facility for dispensing a coating composition against a substrate such as flat glass to be coated when practicing this invention.

An alternative means for heating the gas reactant mixture is a preheater for heating the additional volume of diluting gas to be combined with the volume of fluidizing gas and dispersed particulate solid coating reactant. In accordance with this embodiment of the invention, the facility for heating the mixture is the described aspirator in combination with a preheater for heating the additional volume of gas or the described aspirator having a heater directly associated with it.

In its method, this invention comprises an improvement to a process for coating a substrate with a film by deposition from a gaseous or vaporous reactant composition wherein a solid phase coating reactant is vaporized and the resulting vapors are conveyed into contact with the substrate to be coated. This particular improvement includes fluidizing a particulate solid coating reactant with a gas at a first temperature substantially below the reaction or decomposition temperature of the reactant; drawing a volume of fluidizing gas and dispersed or suspended particulate solid coating reactant from the fluidized mass as a particulate reactant-gas composition; mixing the particulate reactant-gas composition with an additional volume of gas which is also at a temperature below the reaction or decomposition temperature of the reactant to dilute the particulate reactant-gas composition; and heating the diluted particulate reactant-gas composition to a sufficient temperature to vaporize the reactant yet maintaining it below its reaction or deposition temperature. The heated reactant gas composition is then directed into contact with the subject to be coated while the substrate is maintained at a temperature sufficient to cause the reactant in the composition to react, depositing a film on the substrate.

In accordance with one preferred embodiment of this invention, the temperature of the additional volume of gas to be mixed with the fluidizing gas and the fluidized particulate solid coating reactant is at a temperature within the same range as the temperature of the fluidizing gas. The mixture is heated by introducing it into a heating chamber along with a volume of hot gas at a third temperature or by directing it through a heater or heating zone in the chamber to heat the mixture of gas and reactant to a desired temperature for delivery to the surface of the substrate to be coated. In accordance with another preferred embodiment of the invention, the additional volume of gas is heated to a temperature such that its temperature is sufficiently above the temperature of the fluidizing gas so that the step of mixing also serves to heat the fluidizing gas and the dispersed or suspended particulate solid coating reactant to a temperature for the mixture which is sufficient for delivery of the mixture to a substrate to be coated.

The additional volume of gas employed to dilute a volume of fluidizing gas and suspended or dispersed particulate solid coating reactant is a volume which preferably ranges from 3 to 20 times the volume of the particulate reactant fluidizing gas composition so that a substantial dilution occurs during mixing. The fluidizing gas is preferably air when employing pyrolytic reactants; however, other fluidizing gases, such as nitrogen, the noble gases, halogens, and vaporous organic compounds, may be employed as fluidizing gases to achieve certain desired effects such as the deposition of non-oxide films. The diluent gas is also preferably air when employing hydrolytic coating reactants; however, other gases similar to the gases employed as fluidizing gases may also be employed as diluent gases.

Typical representative coating reactants which may be employed in the practice of this invention include metal beta diketonates and other organic metallic salts such as acetates, hexoates, formates, and the like. Acetylacetonates and halogenated acetonates, particularly fluorinated aceylacetonates, may be effectively used as pyrolytic coating reactants. Other suitable coating reactants are organo metallic compounds such as the alkyl and aryl tin halides, particularly fluorides, taught as useful coating reactants in U.S. Pat. No. 3,677,814 to Gillery. The present invention is believed to be applicable to the vaporization of any coating reactant which is employed as a vaporized coating reactant and which must be or can be vaporized from a solid state. The invention is believed applicable to the vaporization of both pyrolytic and hydrolytic reactants.

In a preferred embodiment of this invention, the additional volume of diluent gas is sufficient in volume and pressure to establish turbulence within the flowing mixture of dispersed or suspended particulate reactant and gas leaving an aspirator or other mixing device.

The apparatus disclosed here may also be used to disperse and direct an unvaporized particulate solid coating reactant against a hot substrate surface in order to deposit a film by pyrolytic reaction. Ambient air may be used effectively as a fluidizing and diluting gas for this purpose. No heating by the introduction of a hot gas or by passing a mixture of reactant and gas through a heater is required when practicing this embodiment of the invention. By using a finely divided powder of coating reactant, good quality (small grain and uniform texture) films may be produced on glass even though the reactant is not vaporized for delivery to the substrate.

The fluidizing and diluting gases (e.g. air) may be kept at temperatures below 120° F. (50° C.) although they are preferably maintained between 60° F. and 80° F. (15° C. to 25° C.). No preignition or decomposition will be observed under these conditions. The substrate (metal, ceramic, glass or the like) is kept at a temperature above 400° F. (205° C.) to facilitate immediate pyrolysis of the reactant upon contact. The substrate, particularly glass, is preferably maintained at a temperature of from 1000° F. to 1300° F. (540° C. to 705° C.).

This invention may be further appreciated with reference to a drawing illustrating a preferred apparatus.

BRIEF DESCRIPTION OF THE DRAWING

The drawing illustrates, in a partially cut-away perspective, a fluidizing, vaporizing and chemical-vapor deposition apparatus.

DESCRIPTION OF THE PREFERRED EMBODIMENTS

Referring now to the drawing, there is shown a substrate 11 to be coated. The substrate is preferably a sheet of flat glass although other substrates, such as bottles or other containers or webs of metal or paper, may be coated in accordance with this invention. Adjacent the substrate 11 is a vaporization chamber 12 connected to a coating vapor distributor 13 disposed in facing relation to the substrate 11 to be coated. A fluidizing chamber 15 is provided in accordance with this invention.

The fluidizing chamber 15 comprises a cylindrical enclosure 17 having an inlet conduit 19 and an inlet gas chamber 21. Inside the enclosure 17 is a gas distribution plate 23 mounted across it to support a mass of particulate solid reactant and to distribute a fluidizing gas, such as air under pressure, through the mass of coating reactant. The chamber 15 is provided with an outlet conduit 27 through which fluidizing gas and suspended or dispersed particulate solid coating reactant may be drawn from the chamber 15.

Connected to the conduit 27 is a vacuum ejector assembly (aspirator) 29 serving as a facility for drawing a volume of fluidized particulate solid reactant and fluidizing gas from the chamber 15 and for mixing an additional volume of diluent gas with the withdrawn mixture. The vacuum ejector 29 includes a Venturi channel 31. An inlet conduit 33 extends into the ejector 29 and terminates in a gas ejector nozzle 35 in the throat of the Venturi 31. The vacuum ejector assembly 29 is connected through an outlet conduit 37 to the vaporization chamber 12.

The vaporization chamber 12 includes inlet gas conduits 41 for receiving an additional volume of gas, such as air, when it is desired to further dilute or heat an incoming mixture of reactant and gas from the vacuum ejector assembly 29. Internally, the vaporizer 12 may be provided with gas distribution facilities such as illustrated in U.S. Pat. No. 3,970,037. The vaporizer 12 further includes inlet conduits 43 for receiving a heat transfer fluid, such as hot oil, to an internally disposed heater or radiator such as shown in U.S. Pat. No. 3,970,037 to further heat a reactant-gas composition entering the vaporizer 12 from the vacuum ejector assembly 29.

A coupling or series of couplings 45 join the vaporizer 12 with the vapor distribution assembly 13. Mounted on the vapor distribution assembly 13 are nozzles 47 for distributing the vapors of coating reactant along with the carrier gas comprising the fluidized gas and the diluent gas against the surface of the substrate 11 to be coated.

In accordance with one embodiment, the diluent gas conduit 33 may be connected to a preheater 49 which, in turn, is provided with an inlet conduit 51 for receiving the diluent gas under ambient or other conditions. The preheater 49 serves to heat the diluent gas so that as it is ejected into the Venturi 31 through the ejector nozzle 35, it not only mixes with the fluidizing gas and dispersed or suspended particulate solid coating reactant drawn into the Venturi 31, but also serves to heat the mixture. An electric resistance preheater 49 is disclosed and it is provided with electrical connections 53 for connection to a source of power (not shown).

While this invention has been described with reference to particularly preferred embodiments thereof, those skilled in the art will recognize that variations may be made from these preferred embodiments without departing from the spirit of this invention or its scope as defined by the appended claims.

I claim:

1. In a method of coating a substrate with a film by deposition from a reactant composition wherein the reactant composition is caused to react at a surface of the substrate by maintaining the substrate at a temperature sufficient to cause pyrolysis of the reactant composition upon its contact therewith, the improvement which comprises fluidizing a mass of particulate solid coating reactant with a gas at a temperature substantially below the reaction temperature, decomposition temperature or vaporization temperature of the reactant;

drawing a volume of fluidizing gas and suspended particulate solid reactant from the fluidized mass as a particulate reactant-gas composition;

mixing the withdrawn volume of particulate reactant-gas composition with an additional volume of gas to dilute the particulate reactant-gas composition while maintaining the temperature of the mixture below the reaction temperature, decomposition temperature or vaporization temperature of the reactant; and directing the mixture against a substrate dispersing the solid reactant over a surface of it while maintaining the substrate at a sufficient temperature to cause the solid reactant to react depositing a film.

2. The method according to claim 1 wherein the particulate reactant-gas mixture is maintained at a temperature below about 120° F. (50° C.) prior to directing it against a substrate and maintaining the substrate at a temperature above about 400° F. (205° C.).

3. The method according to claim 2 wherein the particulate reactant-gas mixture is maintained at a temperature of from about 60° F. to 80° F. (15° C. to 25° C.) prior to directing it against a substrate and the substrate is maintained at a temperature from about 1000° C. to 1300° F. (540° C. to 705° C.).

4. The method according to claim 1, wherein the diluted particulate reactant-gas composition is heated to a temperature above the vaporization temperature of the reactant prior to directing the composition against a substrate to be coated.

5. The method according to claim 4, wherein the temperature of the diluting gas is sufficiently greater than the temperature of the fluidizing gas to accomplish said heating.

6. The method according to claim 4 wherein said heating is accomplished by introducing the diluted particulate reactant-gas composition into a heating chamber.

7. The method according to claim 4, wherein the diluted particulate reactant-gas composition is heated by further dilution with a hot gas.

8. The method according to claim 7 wherein the composition is further heated to a desired temperature for contacting the substrate to be coated by conveying the composition through a heating zone.

9. The method according to claim 4 wherein the reactant-gas composition and diluting gas are introduced into a heating chamber under conditions to establish turbulence within the heating chamber.

10. The method according to claim 1 wherein a volume of fluidizing gas and particulate reactant is mixed with 3 to 20 volumes of diluting gas.

11. The method according to claim 1 wherein said volume of fluidizing gas and fluidized particulate reactant is drawn from the fluidized mass through a vacuum ejector and the additional volume of diluting gas is introduced into the vacuum ejector under pressure in a sufficient volume to establish a vacuum therein causing the volume of fluidizing gas and fluidized particulate reactant to be drawn into and through the vacuum ejector.

* * * * *